United States Patent
Park et al.

(10) Patent No.: US 7,623,366 B2
(45) Date of Patent: Nov. 24, 2009

(54) SEMICONDUCTOR DEVICE HAVING A FIELD EFFECT SOURCE/DRAIN REGION

(75) Inventors: Ki-Tae Park, Seongnam-si (KR); Jung-Dal Choi, Suwon-si (KR); Uk-Jin Roh, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 349 days.

(21) Appl. No.: 11/643,022

(22) Filed: Dec. 20, 2006

(65) Prior Publication Data

US 2007/0205445 A1     Sep. 6, 2007

(30) Foreign Application Priority Data

Dec. 20, 2005     (KR)     ............ 10-2005-0126255

(51) Int. Cl.
*G11C 5/06*     (2006.01)
*G11C 11/34*     (2006.01)
*G11C 16/04*     (2006.01)
*H01L 29/80*     (2006.01)
*H01L 21/337*     (2006.01)

(52) U.S. Cl. ............. 365/72; 365/63; 365/185.05; 365/185.17; 257/256; 257/347; 257/E21.21; 438/186; 438/257

(58) Field of Classification Search ............ 365/185.05, 365/63, 72, 185.17; 257/44, 256, 347, E21.21; 438/186, 257

See application file for complete search history.

(56) References Cited

U.S. PATENT DOCUMENTS

| | | | | |
|---|---|---|---|---|
| 4,706,251 A | * | 11/1987 | Rona | ............ 372/4 |
| 6,794,707 B1 | | 9/2004 | Cao | |
| 7,416,940 B1 | * | 8/2008 | Torii et al. | ............ 438/257 |
| 2004/0115888 A1 | * | 6/2004 | Chang | ............ 438/285 |
| 2004/0206951 A1 | * | 10/2004 | Mirabedini et al. | ........... 257/19 |
| 2004/0235264 A1 | * | 11/2004 | Forbes | ............ 438/429 |
| 2005/0054150 A1 | * | 3/2005 | Mirabedini et al. | ......... 438/199 |
| 2005/0087795 A1 | | 4/2005 | Sakuma et al. | |
| 2005/0173751 A1 | | 8/2005 | Ishii et al. | |
| 2006/0220127 A1 | * | 10/2006 | Mantl | ............ 257/347 |

(Continued)

FOREIGN PATENT DOCUMENTS

JP     11-224940     8/1999

(Continued)

OTHER PUBLICATIONS

English Abstract for Publication No. 100206717.

(Continued)

*Primary Examiner*—Ly D Pham
(74) *Attorney, Agent, or Firm*—F. Chau & Associates, LLC

(57) ABSTRACT

A semiconductor device includes an active region defined in a semiconductor substrate, and gate electrodes crossing over the active region. Source/drain regions are defined in the active region on two sides of the gate electrode. At least one of the source/drain regions is a field effect source/drain region generated by a fringe field of the gate. The other source/drain region is a PN-junction source/drain region having different impurity fields and different conductivity than the substrate. At least one of the source/drain regions is a field effect source/drain region. Accordingly, a short channel effect is reduced or eliminated in the device.

20 Claims, 11 Drawing Sheets

U.S. PATENT DOCUMENTS

2006/0258089 A1* 11/2006 Chung-Zen .................. 438/257
2007/0013006 A1* 1/2007 Mirabedini et al. ......... 257/369

FOREIGN PATENT DOCUMENTS

| JP | 2005-101066 | 4/2005 |
| JP | 2005-223234 | 8/2005 |
| KR | 100206717 | 4/1999 |
| KR | 1020050029693 A | 3/2005 |
| KR | 1020050080438 A | 8/2005 |
| KR | 1020050106940 | 11/2005 |
| WO | WO 2005/008782 | 1/2005 |

OTHER PUBLICATIONS

English Abstract for Publication No. 1020050106940.

* cited by examiner

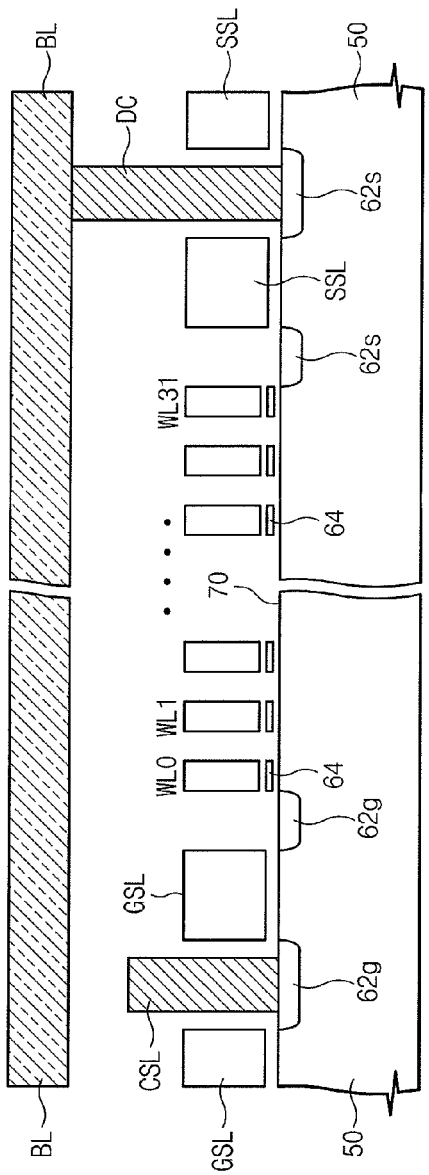
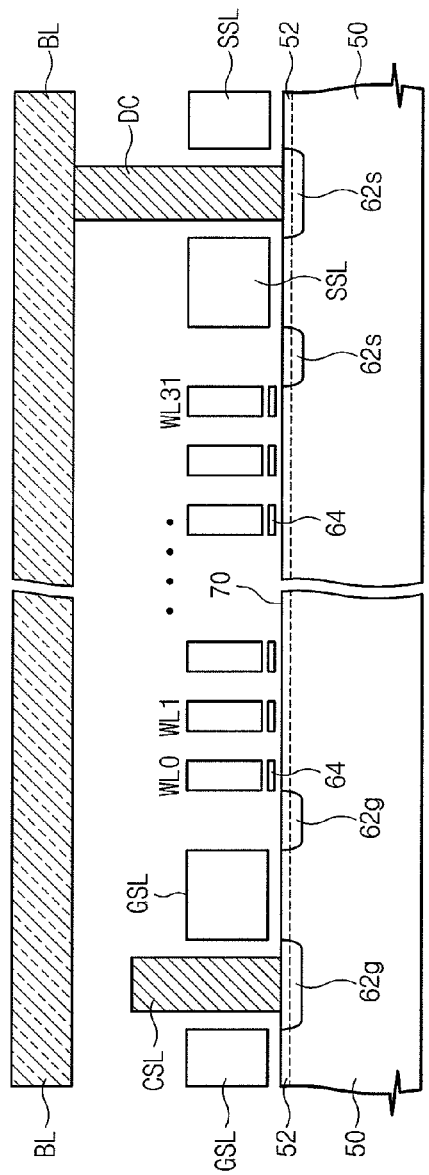
Fig. 4B
Fig. 4C

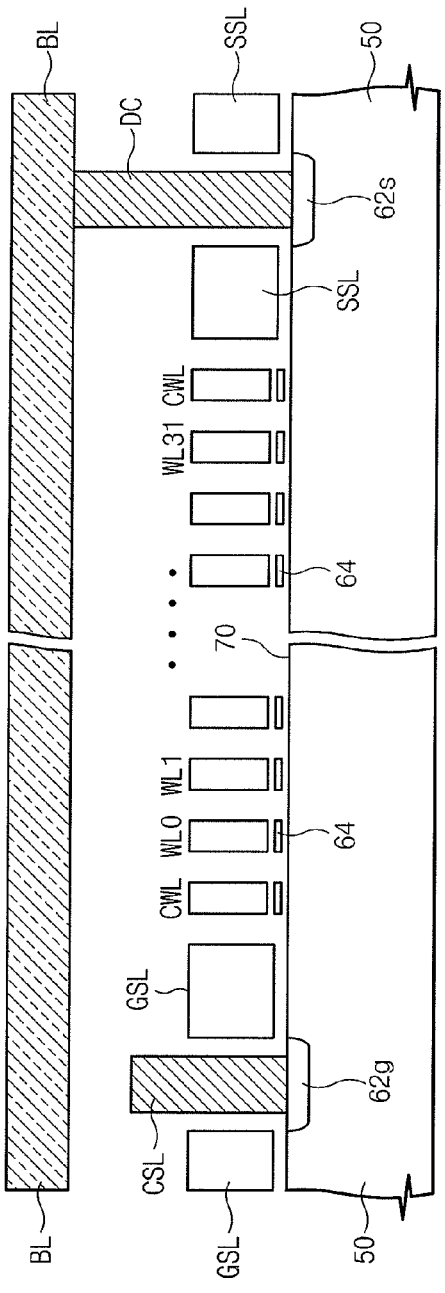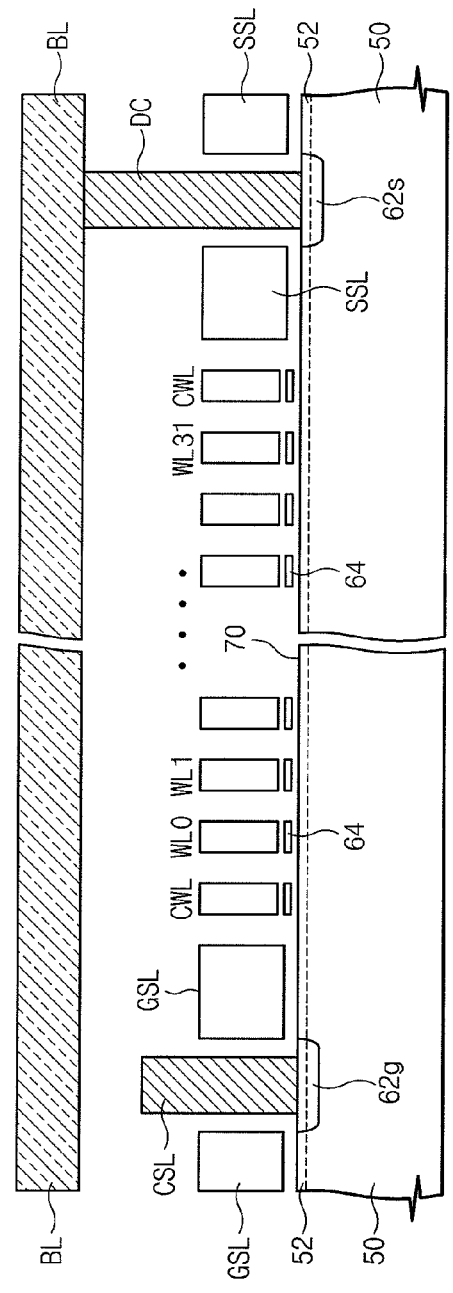

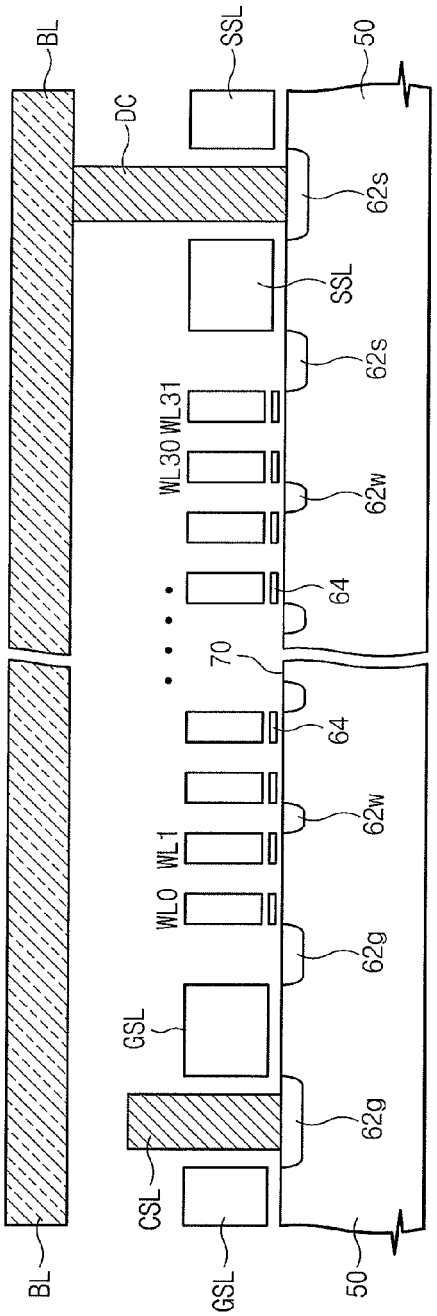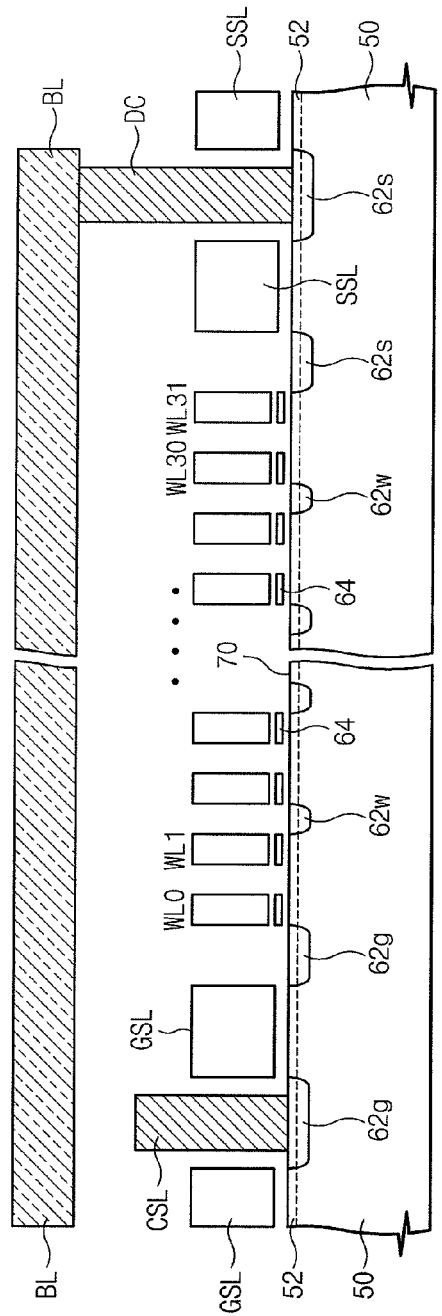

SEMICONDUCTOR DEVICE HAVING A FIELD EFFECT SOURCE/DRAIN REGION

CROSS-REFERENCE TO RELATED APPLICATIONS

This U.S. non-provisional patent application claims priority under 35 U.S.C. § 119 to Korean Patent Application 10-2005-0126255 filed on Dec. 20, 2005, the entire contents of which are hereby incorporated by reference.

BACKGROUND

1. Technical Field

The present disclosure relates to semiconductor device technologies, and in particular, to a semiconductor device having field effect source/drain region(s).

2. Discussion of the Related Art

With higher integration of semiconductor devices, the dimensions of channels in transistors are scaling down. This often exacerbates short channel effects. Short channel effect becomes especially serious as the gate width of transistors approaches several tens of nanometers. In these cases, variation of threshold voltages may result. To overcome the short channel effect, halo junction structures has been proposed. However, this approach reduces on-current and increasing leakage current.

Therefore, the halo junction structure may not be ideal for handling short channel effect in sub-nano scaled flash memory devices.

FIG. 1A is an equivalent circuit diagram of a general semiconductor device, and FIG. 1B is a sectional diagram of a general semiconductor device.

Referring to FIGS. 1A and 1B, a flash memory device includes pluralities of cell strings. Each cell string is constructed of a plurality of memory cell transistors connected between ground and string selection transistors. Each memory cell is comprised of a ground selection line GSL coupled to gate electrodes of the ground selection transistors, and a string selection line SSL coupled to gate electrodes of the string selection transistors. Pluralities of word lines (e.g., WL0-WL31) are arranged between the ground selection lines GSL and the string selection lines SSL. The word lines are coupled with gate electrodes of the memory cell transistors. Source regions of the ground selection transistors link with each other to form a common source line CSL. Drain regions of the string selection transistors are each connected to bit lines BL0-BLn. The bit lines BL0-BLn are each connected to the drain regions of the string selection transistors, crossing over the word lines WL0-WL31.

As shown in FIG. 1B, the word lines WL0-WL31, the ground selection line GSL, and the string selection line SSL are arranged over an active region defined in a semiconductor substrate 10. Cell source/drain regions 12w are formed in the active region between the word lines WL0-WL31. Source/drain regions 12g and 12s are respectively formed in the active region at both sides of the ground selection line GSL and both sides of the string selection line SSL. Between the word lines WL0-WL31 and the substrate 10 are interposed storage regions 14. Each of the storage regions 14 maybe comprised of an isolated floating gate, a charge-trapping insulation layer, and/or a nano-crystal conductor in accordance with a kind of cell transistor.

As illustrated in FIG. 1B, the source/drain regions, 12g, 12w, and 12s, of the general semiconductor memory are formed in the structure of PN junctions containing impurities different from those of the substrate 10. Further, the source/drain regions are formed in the junction structure with high breakdown voltage since a high voltage is applied thereto.

As shown in FIG. 2, the general source/drain region is configured in a double-diffused drain (DDD) structure operable in a high breakdown voltage and a small breakdown leakage current. When the semiconductor memory device is, for example, a NAND flash memory device, a writing voltage of 18V is applied to a selected word line during a program operation, the channel and source/drain regions of deselected memory cells coupled to the selected word line are self-boosted up to about 8V. Thus, the source/drain junction structure is designed to be the DDD style equipped with heavily and lightly doped diffusion regions 16 and 18 so as to permit a breakdown voltage of the source/drain junction to be higher than 8V. The DDD junction is useful for reducing leakage current $I_L$, but it may cause a short channel effect, such as punch-through, due to adoption of the lightly-doped diffusion layer and a drain-induced barrier lowering (DIBL) effect due to overlap between the gate electrode (e.g., the word line WL) and the diffusion layer. Such a short channel effect induces extension of sub-threshold leakage and deterioration of sub-threshold swing in the memory cell transistor, further spreading a distribution profile of threshold voltages.

SUMMARY OF THE INVENTION

A semiconductor device according to an exemplary embodiment of the present invention has a source/drain structure free from a short channel effect even when a channel length of a transistor is scaled down.

A nonvolatile device according to an exemplary embodiment of the present invention has a source/drain structure free from a short channel effect.

Embodiments of the present invention provide a semiconductor device having a source/drain region generated by a fringe field from a gate electrode. The device is comprised of a semiconductor substrate and a gate electrode crossing over the active region. Source/drain regions are defined at the active region at both sides of the gate electrode. At least one of the source/drain regions is a field effect source/drain region generated by a fringe field from the gate electrode. The other of the source/drain regions is a PN-junction source/drain region that has an impurity layer different than the substrate.

The fringe field is induced by applying a voltage to the gate electrode. The source/drain region is an inversion layer set on the surface of the active region by the fringe field. The surface of the active region may be formed from a mobility-enhanced layer so as to enhance the amount of on-current therein. For example, the surface of the active region may be formed of a lightly-doped or undoped semiconductor layer or a strained silicon layer.

Exemplary embodiments of the present invention also offer a nonvolatile memory device where a charge storage layer is interposed between the gate electrode and the active region. For example, the nonvolatile memory device is comprised of a semiconductor substrate, an active region defined in the semiconductor substrate, and ground and string selection transistors disposed in the active region. Pluralities of cell transistors are disposed between the ground and string selection transistors. At least one of the source/drain regions of the cell transistors is a field effect source/drain region generated by a fringe field from the gate electrode.

Exemplary embodiments of the present invention are discussed below with reference to the drawings.

BRIEF DESCRIPTION OF THE FIGURES

Features of the exemplary embodiments of the present disclosure will become apparent and more readily appreciated from the following description taken in conjunction with the accompanying drawings of which:

FIG. 4B is a sectional diagram illustrating the semiconductor device of FIG. 4A;

FIG. 4C is a sectional diagram illustrating the semiconductor device according to a modification of the exemplary embodiment of FIG. 4A;

FIG. 5B is a sectional diagram illustrating the semiconductor device of FIG. 5A;

FIG. 5C is a sectional diagram illustrating the semiconductor device according to a modification of the exemplary embodiment of FIG. 5A;

FIG. 6B is a sectional diagram illustrating the semiconductor of FIG. 6A;

FIG. 6C is a sectional diagram illustrating the semiconductor device according to a modification of the exemplary embodiment of FIG. 6A;

DETAILED DESCRIPTION OF EXEMPLARY EMBODIMENTS

Figure 1A:
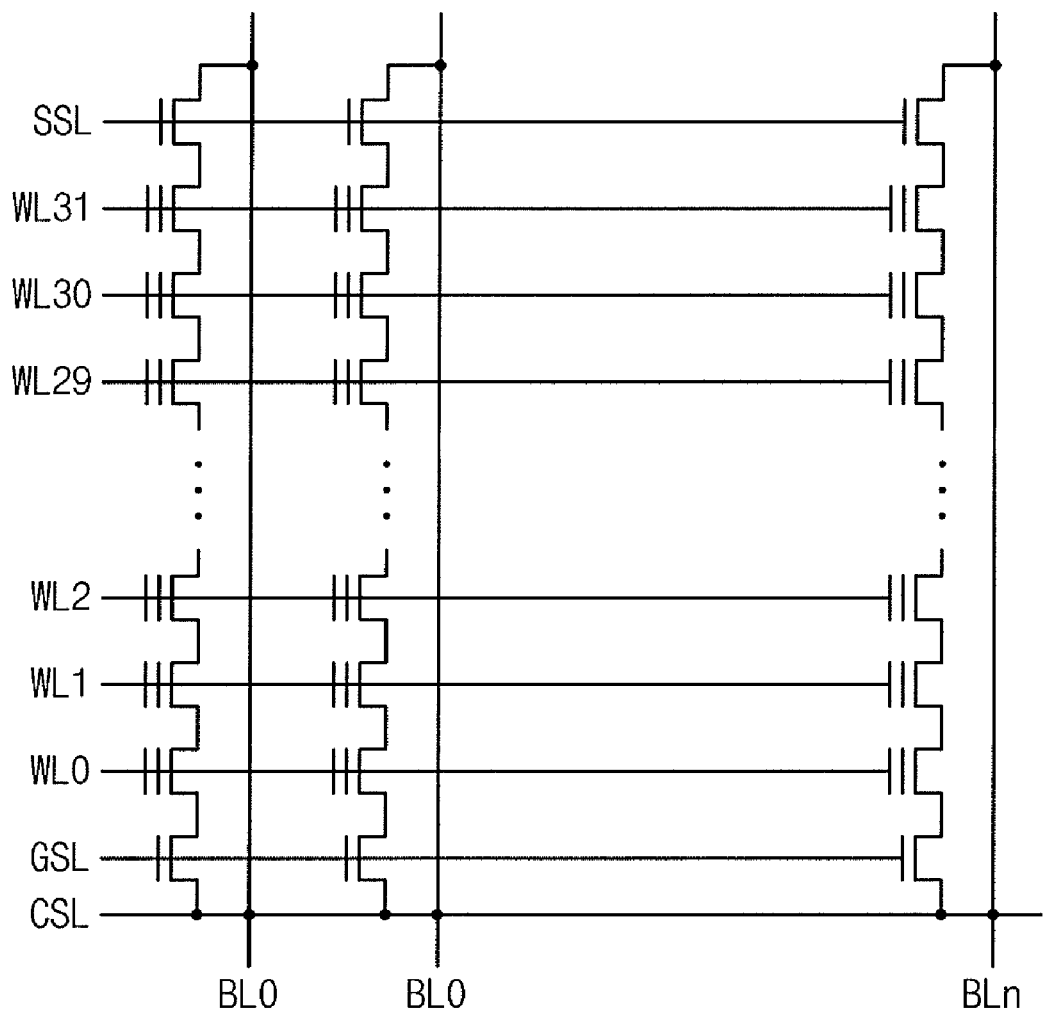
FIG. 1A is an equivalent circuit diagram of a general semiconductor device.
Figure 1B:
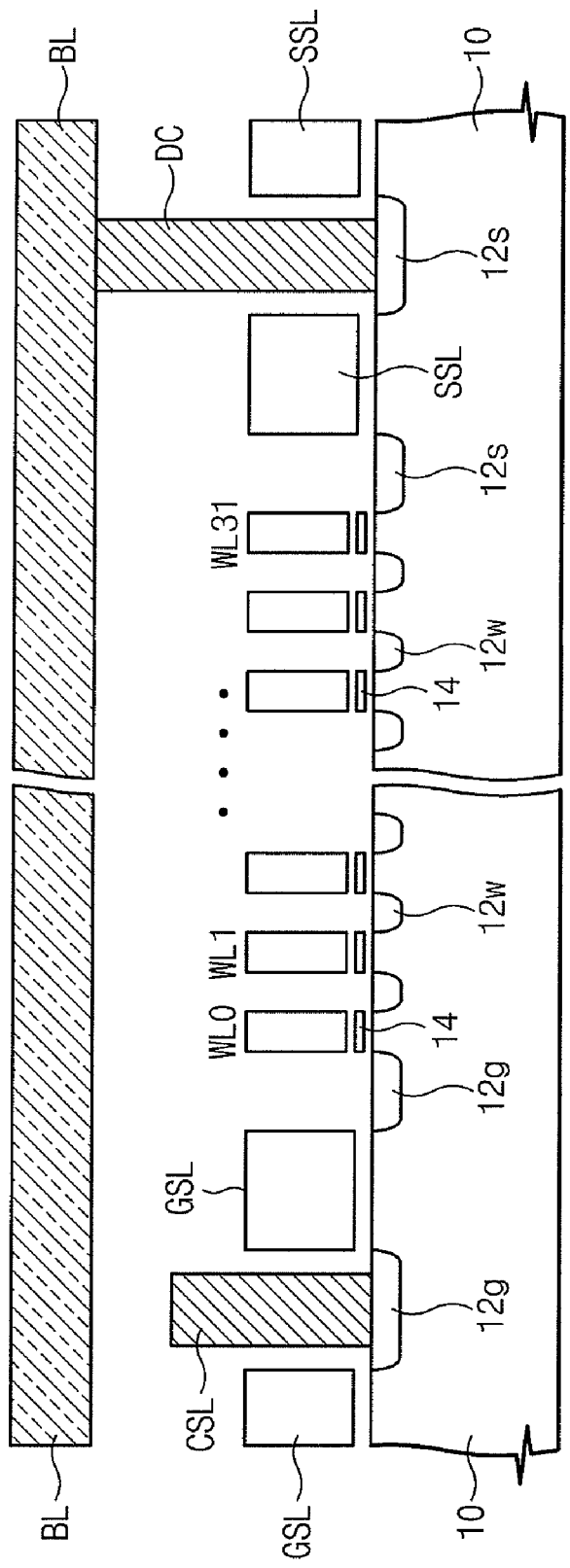
FIG. 1B is a sectional diagram of a general semiconductor device.
Figure 2:
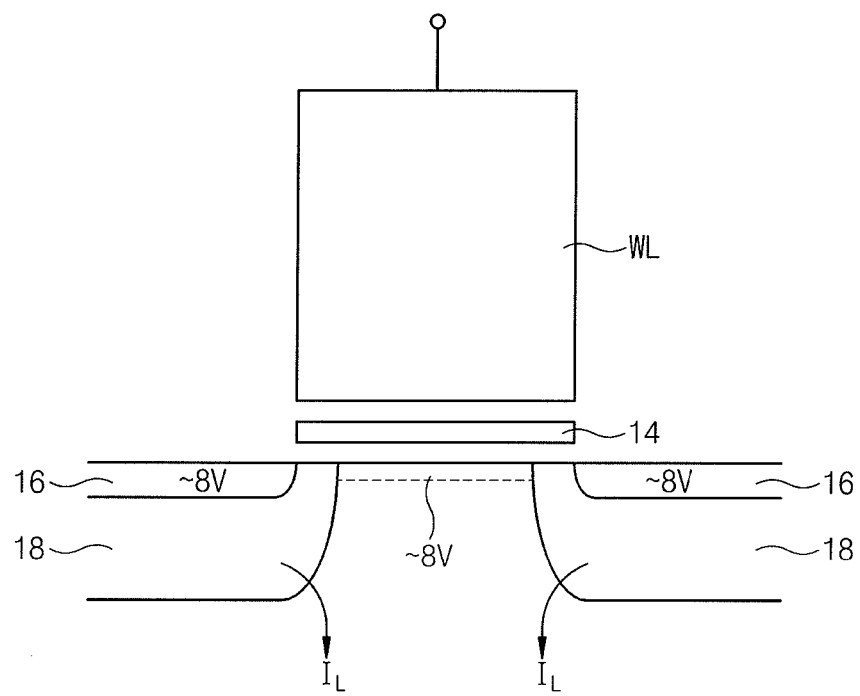
FIG. 2 is a sectional diagram showing a general double diffusion drain structure.

Exemplary embodiments of the present invention will be described below in more detail with reference to the accompanying drawings.

In the figures, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout.

Figure 3:
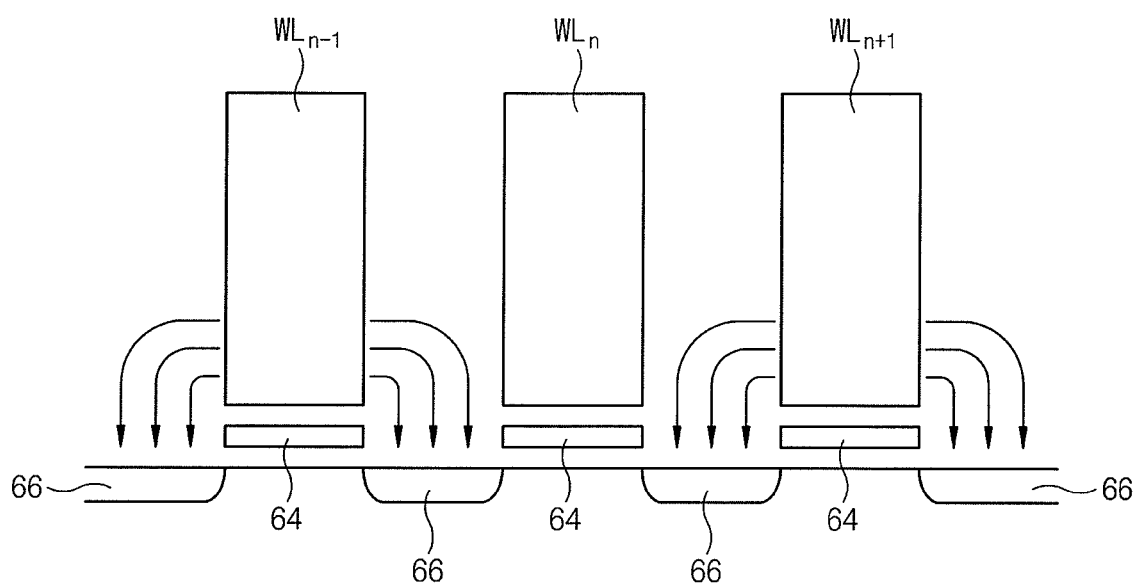
FIG. 3 is a sectional diagram illustrating a semiconductor device in accordance with an exemplary embodiment of the present invention.

FIG. 3 is a sectional diagram illustrating a semiconductor device in accordance with an exemplary embodiment of the present invention.

Referring to FIG. 3, the semiconductor device excludes PN-junction source/drain regions formed of diffusion layers that are different from a substrate in conductivity. Voltages applied to gate electrodes $WL_{n-1}$-$WL_{n+1}$ induce fringe fields. Inversion layers 66 generated on the surface of the substrate by the fringe fields function as source/drain regions. According to this structure, junction leakage may be reduced or eliminated ads a result of the achieved programming/erasing characteristic. The dimensions of transistors may be scaled down because, as a result of the immunity from short channel effect, there is no need to modify a structure of diffusion layers, as is done with the DDD form.

Figure 4A:
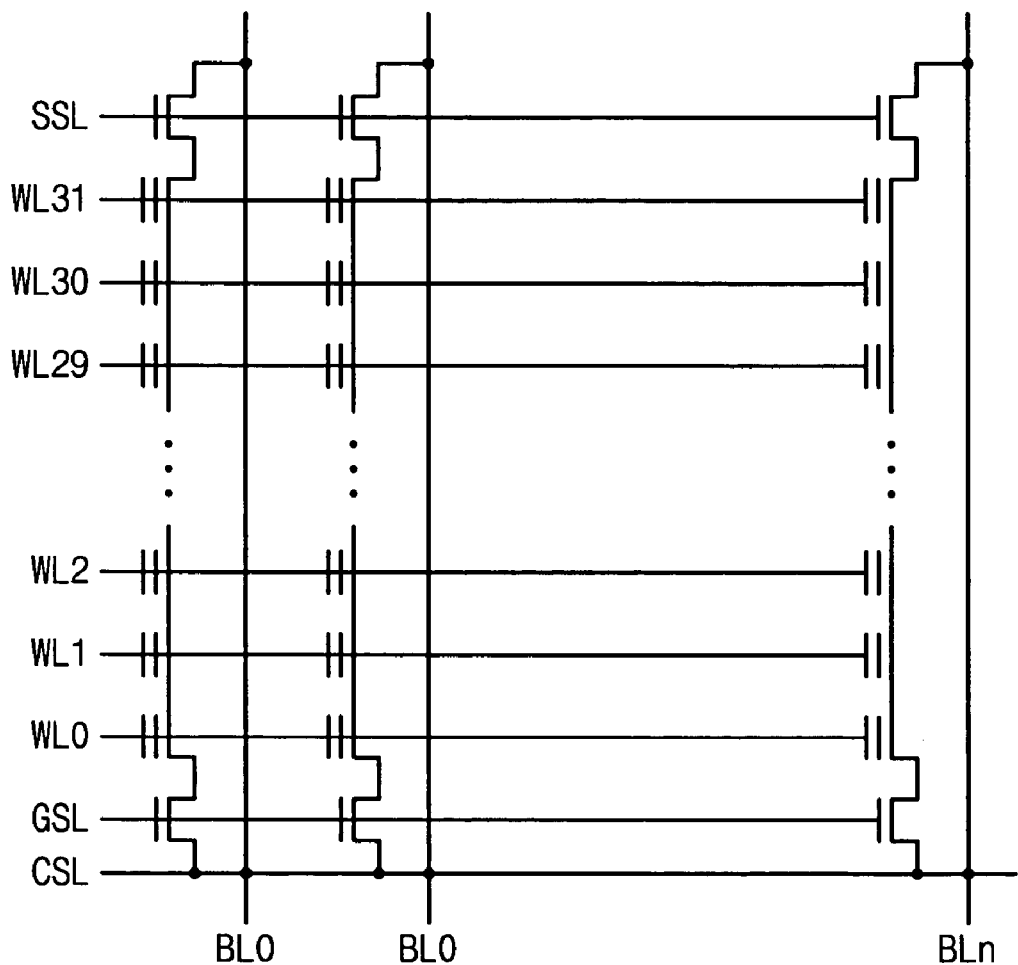
FIG. 4A is an equivalent circuit diagram illustrating a semiconductor device according to an exemplary embodiment of the present invention.

FIG. 4A is an equivalent circuit diagram illustrating a NAND-type nonvolitile memory device according to an embodiment of the present invention. FIG. 4B is a section along the direction of bit line, illustrating the NAND-type nonvolatile memory device of FIG. 4A.

Referring to FIG. 4A, a cell string of the NAND-type nonvolatile memory device includes pluralities of memory cell transistors connected between ground and string selection transistors. A PN-junction source/drain region is not present between the memory cell transistors.

A memory cell array includes a ground selection line GSL coupled to gate electrodes of ground selection transistors, a string selection line SSL coupled to gate electrodes of string selection transistors and arranged in parallel with the ground selection line GSL, and pluralities of word lines (e.g., WL0-WL31) parallel with each other and coupled to gate electrodes of the cell transistors between the ground selection line GSL and string selection line SSL. In the memory cell array, a common source line CSL connected to source regions of the ground selection transistors is arranged in parallel with the word lines WL0-WL31. The bit lines BL0-BLn are connected to drain regions of string selection transistors and cross over the word lines WL0-WL31.

Referring to FIG. 4B, the ground selection transistors, the string selection transistors, and the cell transistors are formed in an active region 70 defined in a semiconductor substrate 50. The string selection line SSL, the ground selection line GSL, and the word lines WL0-WL31 are arranged crossing over the active region 70. The bit line BL (e.g., BLn of FIG. 4A) is connected to the source/drain region placed at a side of the string selection line SSL through a bit line contact DC. Each word line includes a charge storage layer 64 interposed between the gate electrode and the active region 70. The charge storage layer 64 may comprise a floating gate or a charge-storing insulation layer in a SONGS structure. Otherwise, the charge storage layer 64 may comprise a semiconductor or a metallic nano-crystalline layer.

Source/drain regions 62g formed at both sides of the ground selection line GSL and source/drain regions 62g formed at both sides of the string selection line SSL are kinds of PN-junction source/drain regions formed of diffusion layers with conductivity opposite to that of the substrate. Source/drain regions between the word lines WL0-WL31 are structured as inversion layers called field effect source/drain regions. The inversion layers are generated by fringe fields induced from voltages applied to the adjacent word lines. The active regions corresponding to the channel and source/drain regions of the transistors are formed with enhanced charge mobility to compensate for lack of on-current by adopting the structure of field effect source/drain regions thereto.

FIG. 4C is a sectional diagram illustrating a modification of the exemplary embodiment of FIGS. 4A and 4B.

Referring to FIG. 4C, a mobility-enhanced layer 52 is laid on the surface of the semiconductor substrate 50. The mobility-enhanced layer 52 is doped with concentration in the range of $10^{15}$-$10^{16}$ ions/cm$^3$, and comprises a strained silicon layer, or an intrinsic semiconductive epitaxial layer formed on the semiconductor substrate 50 or a lightly-doped semiconductor substrate.

Figure 5A:
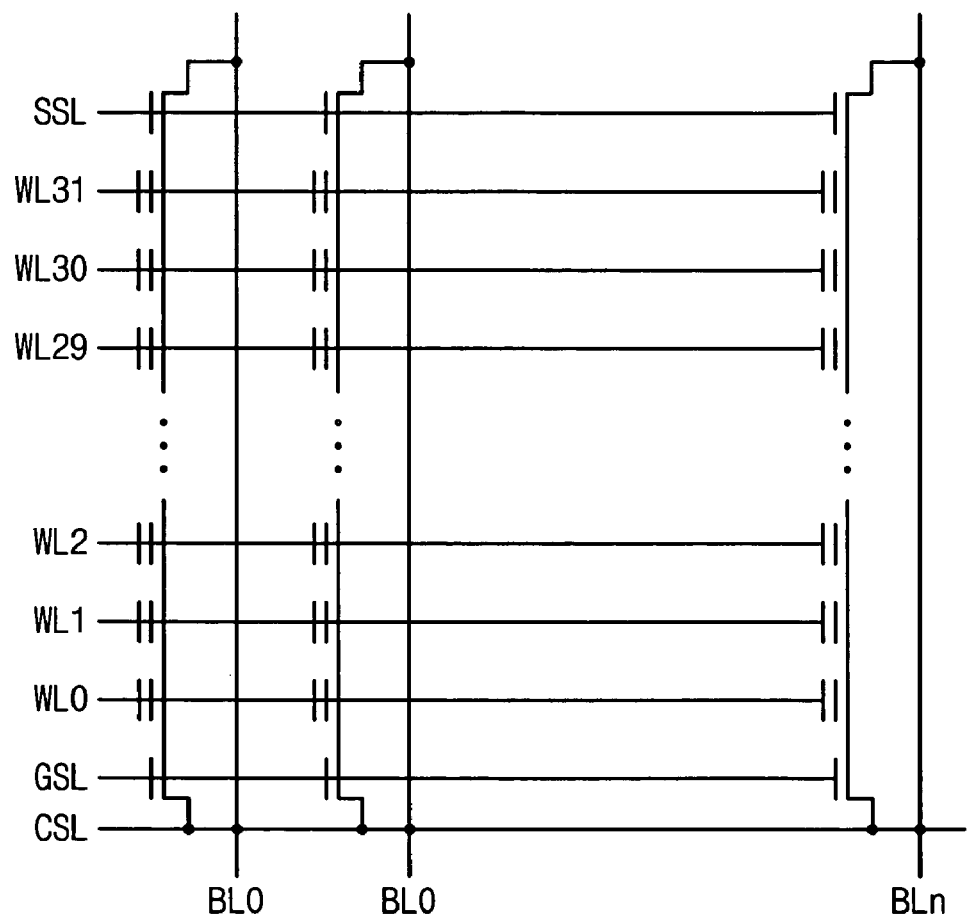
FIG. 5A is an equivalent circuit diagram illustrating a semiconductor device according to an exemplary embodiment of the present invention.

FIG. 5A is an equivalent circuit diagram illustrating a NAND-type nonvolatile memory device according to an embodiment of the present invention. FIG. 5B is a sectional diagram illustrating the NAND-type nonvolatile memory device of FIG. 5A.

Referring to FIG. 5A, in the NAND-type nonvolatile memory device, inversion gate lines CWL, as dummy word lines for activating inversion layers for channels, are disposed between the word line WL31 and the ground selection line GSL, and between the word line WL0 and the string selection line SSL, in parallel with the word lines. The inversion gate lines CWL make it possible to exclude the PN-junction source/drain regions between the word line WL31 and the ground selection line GSL, and between the word line WL0 and the string selection line SSL. The inversion gate lines CWL contribute to lowering capacitive coupling actions by functioning as shielding means between voltages applied to the most outer word lines WL0 and WL31 and voltages applied to the ground and string selection lines GSL and SSL.

Referring to FIG. 5B, as discussed above, the ground and string selection lines GSL and SSL cross over the active region 70. The plural word lines WL0-WL31 are arranged in parallel with each other between the ground selection line GSL and the string selection line SSL. The inversion gate lines CWL are disposed between the first word line WL0 and the ground selection line GSL, and between the last word line WL31; and the string selection line SSL, in parallel with the word lines.

In the active region 70 between the word lines WL0-WL31 and between the inversion gate lines CWL, there is no PN-junction source/drain region. The field effect source/drain regions are generated when a voltage is applied to the adjacent word line or inversion gate line adjacent thereto. The rest of the source/drain regions 62*g* and 62*s* of the ground and string selection transistors are PN-junction source/drain regions.

FIG. 5C is a sectional diagram illustrating a modification of the exemplary embodiment illustrated in FIGS. 5A and 5B.

Referring to FIG. 5C, the mobility-enhanced layer 52 is formed on the surface of the semiconductor substrate 50. The mobility-enhanced layer 52 is doped with concentration in the range of $10^{15}$-$10^{16}$ ions/cm$^3$, comprising a strained silicon layer, or an intrinsic semiconductive epitaxial layer formed on the semiconductor substrate 50 or a lightly-doped semiconductor substrate.

Figure 6A:
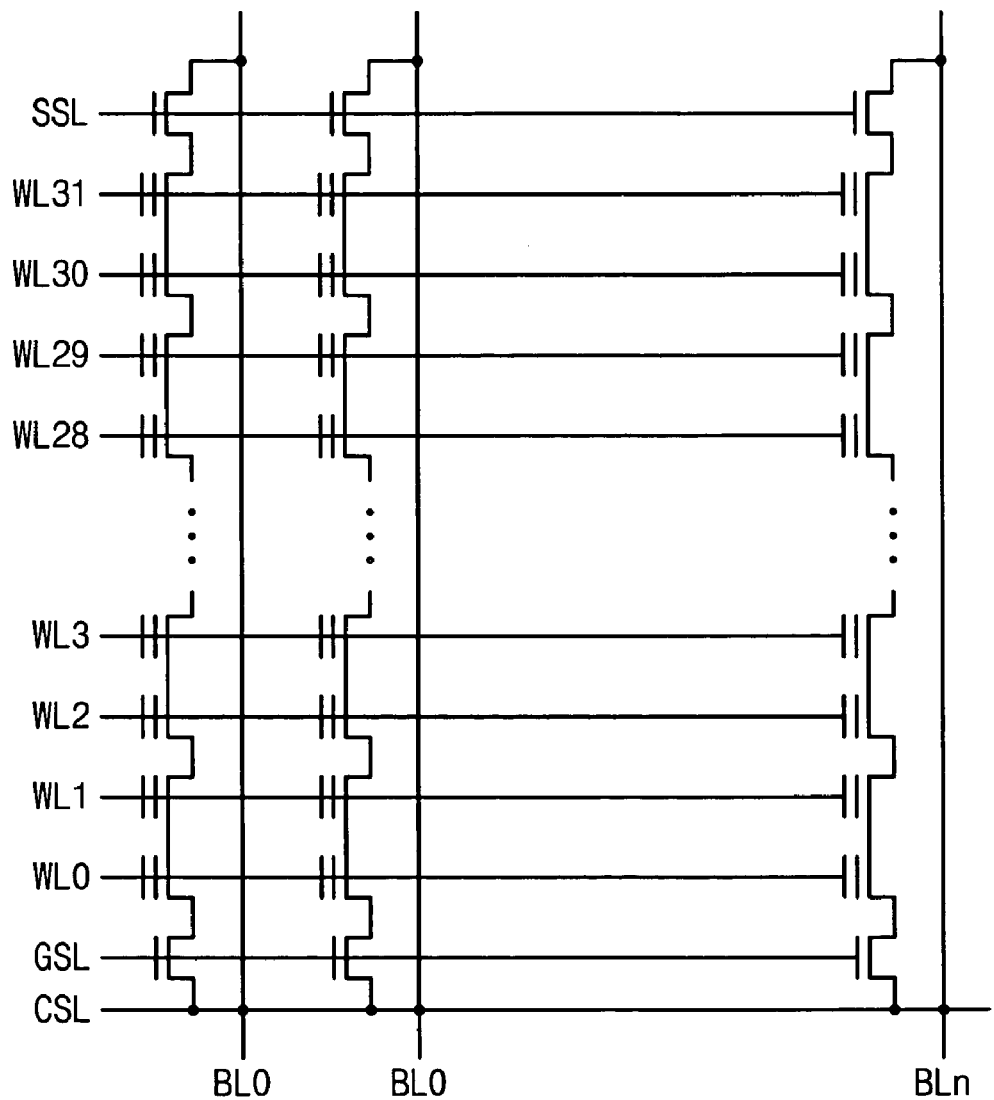
FIG. 6A is an equivalent circuit diagram illustrating a semiconductor device according to an exemplary embodiment of the present invention.

FIG. 6A is an equivalent circuit diagram illustrating a NAND-type nonvolatile memory device according to an exemplary embodiment of the present invention. FIG. 6B is a sectional diagram illustrating the NAND-type nonvolatile memory device of FIG. 6A.

Referring to FIG. 6A, a memory cell transistor of the NAND-type nonvolatile memory device by the invention may be comprised of at least one field effect source/drain region. For instance, as shown in FIG. 6A, one of the source/drain regions in the memory cell transistor may be configured in the field effect type while the other may be the PN-junction type. The source/drain regions of the ground and string selection transistors are all of the PN-junction types. One of the source/drain regions in the memory cell transistor is of the field effect type while the other is of the PN-junction type.

Referring to FIG. 6B, on the semiconductor substrate 50 are disposed the ground and string selection lines GSL and SSL between which the plural word lines WL0-WL31 are arranged. In the active region 70 at both sides of the string selection line SSL and ground selection line GSL, the PN-junction source/drain regions 62*s* and 62*g* are settled. In the active region 70 between the word lines WL0-WL31, PN-junction source/drain regions 62*w* and field effect source/drain regions are alternately disposed. Namely, the PN-junction source/drain regions 62*w* with impurities are formed in one of the active region 70 at both sides of the word lines WL0-WL31 while the other sides are provided without the PN-junction source/drain regions 62*w*. The field effect source/drain regions are conductive by the fringe fields of voltages applied to the adjacent gate electrodes. The short channel effect is accordingly reduced even with the unilateral structure of field effect source/drain region that is placed in at least one of the active region 70 in the memory cell transistor.

FIG. 6C is a sectional diagram illustrating a modification of the exemplary embodiment of FIGS. 6A and 6B.

Referring to FIG. 6C, the mobility-enhanced layer 52 is laid on the surface of the semiconductor substrate 50. The mobility-enhanced layer 52 is doped with concentration in the range of $10^{15}$-$10^{16}$ ions/cm$^3$, and is comprised of a strained silicon layer or an intrinsic semiconductive epitaxial layer formed on the semiconductor substrate 50 or a lightly-doped semiconductor substrate.

Figure 7A:
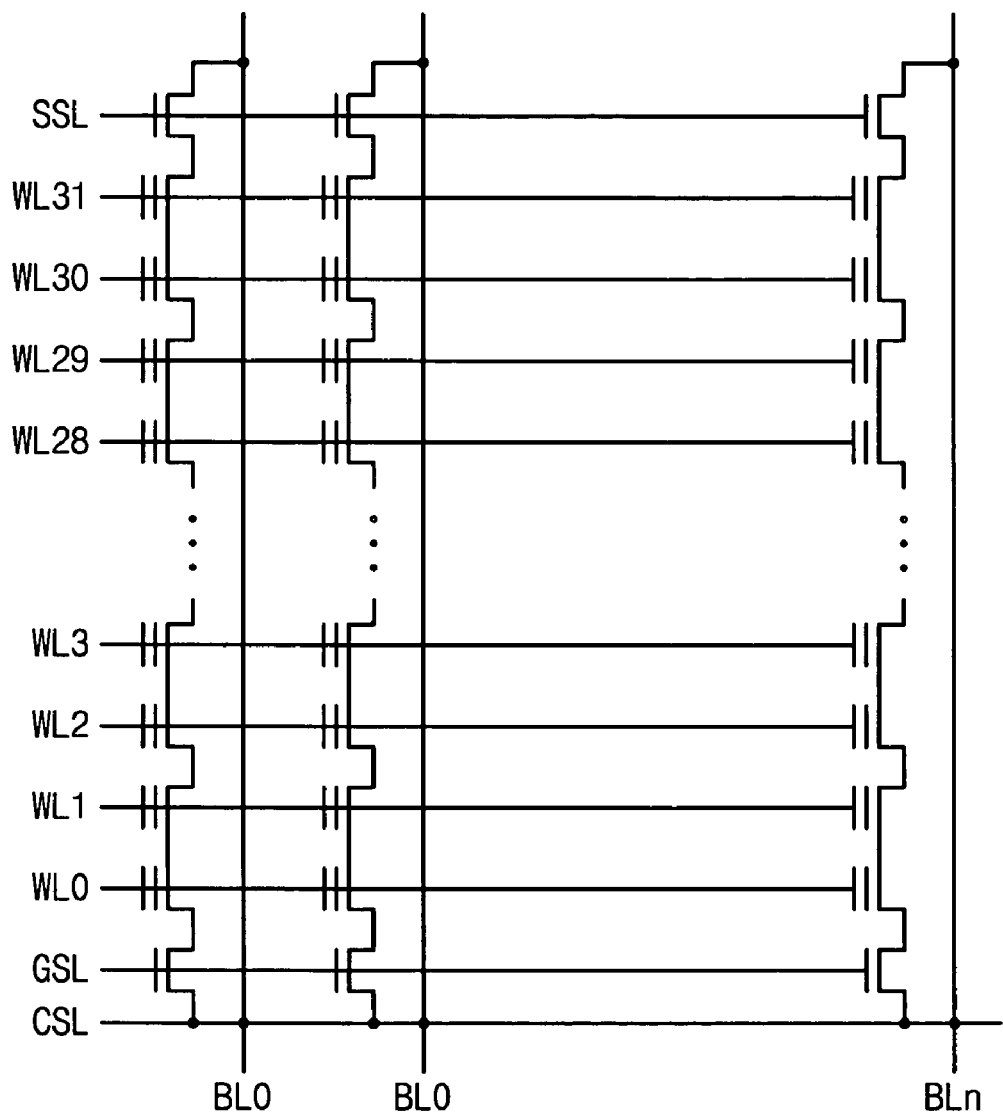
FIG. 7A is an equivalent circuit diagram illustrating a semiconductor device according to an exemplary embodiment of the present invention.
Figure 7B:
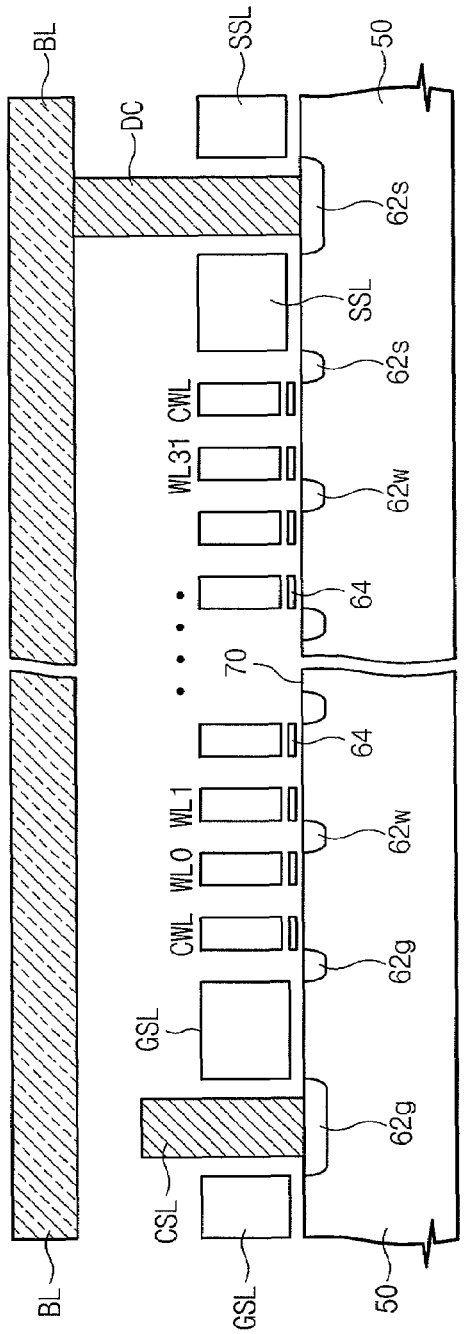
FIG. 7B is a sectional diagram illustrating the semiconductor device of FIG. 7A.

FIG. 7A is an equivalent circuit diagram illustrating a NAND-type nonvolatile memory device according to an exemplary embodiment of the present invention. FIG. 7B is a sectional diagram illustrating the NAND-type nonvolatile memory device according to the exemplary embodiment of FIG. 7A.

Referring to FIG. 7A, in the NAND-type nonvolatile memory device, at least one of the source/drain regions in the memory cell transistor is the field effect source/drain region. The inversion gate lines CWL for channel inversion are disposed between the ground selection transistor and the memory cell transistor and between the string selection transistor and the memory cell transistor.

Referring to FIG. 7B, the inversion gate lines CWL for channel inversion are disposed between the first word line WL0 and the ground selection line GSL and between the last word line WL31 and the string selection line SSL, in parallel with the word lines. The PN-junction source/drain regions, 62*s*, 62*w*, and 62*g*, are formed in one sides of the active region 70 at both sides of the inversion gate lines CWL and the word lines WL0 and WL31. The field effect source/drain regions are formed in the other sides without the PN-junction source/drain regions. For example, the PN-junction source/drain regions may be alternately disposed in the active 70 region between the inversion gate lines CWL and the word lines WL0 and WL31. While FIG. 7B shows that the PN-junction source/drain regions are formed between the inversion gate line CWL and the selection lines GSL and SSL, they may be placed in the other sides of the active region 70 by the inversion gate lines CWL.

Figure 7C:
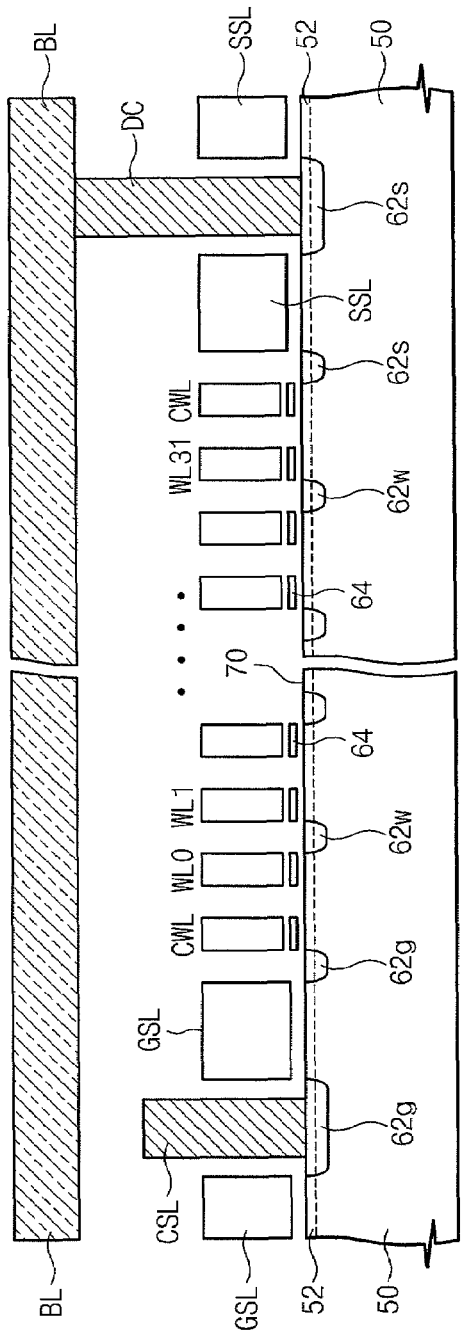
FIG. 7C is a sectional diagram illustrating the semiconductor device according to a modification of the exemplary embodiment of FIG. 7A.

FIG. 7C is a sectional diagram illustrating a modification of the exemplary embodiment shown in FIGS. 7A and 7B.

Referring to FIG. 7C, the mobility-enhanced layer 52 is laid on the surface of the semiconductor substrate 50. The mobility-enhanced layer 52 is doped with concentration in the range of $10^{15}$-$10^{16}$ ions/cm$^3$, comprising a strained silicon layer, or an intrinsic semiconductive epitaxial layer formed on the semiconductor substrate 50 or a lightly-doped semiconductor substrate.

While the aforementioned exemplary embodiments illustrate all or at least one source/drain region of the memory cell transistors as being of the field effect type, it is permissible for the field effect source/drain region to correspond with at least one of the source/drain regions defined in the cell array of the NAND-type nonvolatile memory device.

As described above, the short channel effect may be lessened since at least one of the source/drain regions of the transistor is of the field effect type. A semiconductor device free from short channel effect is therefore provided when the source/drain regions in the transistor are configured in the field effect type.

Exemplary embodiments of the present invention are able to provide a NAND-type nonvolatile memory device without programming/erasing disturbance due to junction leakage caused by PN-junction source/drain regions. This may be accomplished by adopting the field effect source/drain regions, which do not induce the junction leakage, to the memory cell transistors.

What is claimed is:

1. A semiconductor device comprising:
    a semiconductor substrate;
    an active region defined in the semiconductor substrate;
    a gate electrode crossing over the active region,
    two source/drain regions defined within the active region on two sides of the gate electrode,
    wherein at least one of the two source/drain regions is a field effect source/drain region generated by a fringe field from the gate electrode.

2. The semiconductor device as set forth in claim 1, wherein one of the two source/drain regions is the field effect source/drain region while the other of the two source/drain regions is a PN-junction source/drain region.

3. The semiconductor device as set forth in claim 1, wherein a surface of the semiconductor substrate is comprised of a mobility-enhanced layer.

4. The semiconductor device as set forth in claim 3, wherein the mobility-enhanced layer is an undoped semiconductor layer.

5. The semiconductor device as set forth in claim 3, wherein the mobility-enhanced layer is a strained silicon layer.

6. The semiconductor device as set forth in claim 1, which further comprises a charge storage layer interposed between the gate electrode and the substrate,
    wherein the charge storage layer is comprised of a floating gate, a charge-trapping insulation layer, or a nano-crystalline conductive layer.

7. A semiconductor device comprising:
    a semiconductor substrate;
    an active region defined in the semiconductor substrate;
    a ground selection transistor and a string selection transistor disposed in the active region;
    pluralities of cell transistors disposed between the ground selection transistor and the string selection transistor, each of the cell transistors comprising two source/drain regions,
    wherein at least one of the source/drain regions of each of the cell transistors is a field effect source/drain region generated by a fringe field from a gate electrode.

8. The semiconductor device as set forth in claim 7, wherein a surface of the semiconductor substrate is comprised of a mobility-enhanced layer.

9. The semiconductor device as set forth in claim 8, wherein the mobility-enhanced layer is an undoped semiconductor layer.

10. The semiconductor device as set forth in claim 8, wherein the mobility-enhanced layer is a strained silicon layer.

11. The semiconductor device as set forth in claim 7, further comprising a charge storage layer interposed between the gate electrode and the substrate,
    wherein the charge storage layer is comprised of a floating gate, a charge-trapping insulation layer, or a nano-crystalline conductive layer.

12. The semiconductor device as set forth in claim 7, further comprising:
    a ground selection line and a string selection line coupled respectively gate electrodes of the ground selection transistor and the string selection transistor, crossing over the active region; and
    pluralities of word lines disposed between the ground selection line and the string selection line and coupled respectively to gate electrodes of the cell transistors, crossing over the active region,
    wherein the source/drain regions defined in the active region between the word lines are field effect source/drain regions generated by fringe fields from adjacent gate electrodes of the cell transistors.

13. The semiconductor device as set forth in claim 12, wherein the source/drain regions, between the word line and the ground selection line and between the word line and the string selection line, are PN-junction source/drain regions.

14. The semiconductor device as set forth in claim 12, further comprising:
    inversion gate lines disposed between the string selection line and the word lines and between the ground selection line and the word lines, crossing over the active region,
    wherein the source/drain regions defined in the active region at two sides of the inversion gate lines are field effect source/drain regions generated by fringe fields from the inversion gate lines.

15. The semiconductor device as set forth in claim 12, wherein a surface of the active region is formed of an undoped semiconductor layer or a strained silicon layer.

16. The semiconductor device as set forth in claim 7, further comprising:
    a ground selection line and a string selection line coupled respectively to a gate electrode of the ground selection transistor and a gate electrode of the string selection transistor, crossing over the active region; and
    pluralities of word lines disposed between the ground selection line and the string selection line and coupled respectively to gate electrodes of the cell transistors, crossing over the active region,
    wherein one of the source/drain regions of each of the cell transistors is the field effect source/drain region generated by fringe fields from adjacent gate electrodes while the other of the source/drain regions is a PN-junction source/drain region.

17. The semiconductor device as set forth in claim 16, wherein the source/drain regions, between the word line and the ground selection line and between the word line and the string selection line, are PN-junction source/drain regions.

18. The semiconductor device as set forth in claim 16, further comprising:
    inversion gate lines disposed between the string selection line and the word lines and between the ground selection line and the word lines, crossing over the active region, wherein one of the source/drain regions defined in the active region at two sides of the inversion gate line is a field effect source/drain, while the other of the source/drain regions is a PN-junction source/drain region.

19. The semiconductor device as set forth in claim 18, wherein the source/drain regions, between the word lines and the ground selection line and between the word lines and the string selection line, are PN-junction source/drain regions.

20. The semiconductor device as set forth in claim 16, wherein a surface of the active region is formed of an undoped semiconductor layer or a strained silicon layer.

* * * * *